US006664827B2

(12) United States Patent
O'Leary et al.

(10) Patent No.: US 6,664,827 B2
(45) Date of Patent: Dec. 16, 2003

(54) DIRECT DIGITAL SYNTHESIZER PHASE LOCKED LOOP

(75) Inventors: William O'Leary, Plano, TX (US); Edwin W. Rowand, Dallas, TX (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 10/087,521

(22) Filed: Mar. 1, 2002

(65) Prior Publication Data

US 2002/0180498 A1 Dec. 5, 2002

Related U.S. Application Data

(60) Provisional application No. 60/273,017, filed on Mar. 2, 2001.

(51) Int. Cl.[7] .................................................. H03L 7/06
(52) U.S. Cl. ...................................................... 327/156
(58) Field of Search ................................ 327/146–150, 327/155–159; 331/DIG. 2; 375/376

(56) References Cited

U.S. PATENT DOCUMENTS

| | | | |
|---|---|---|---|
| 5,317,601 A | 5/1994 | Riordan et al. | |
| 5,990,715 A | 11/1999 | Nishimura | |
| 5,994,934 A | 11/1999 | Yoshimura et al. | |
| 6,049,239 A | 4/2000 | Eto et al. | |
| 6,242,954 B1 | 6/2001 | Taniguchi et al. | |
| 6,313,676 B1 | 11/2001 | Abe et al. | |
| 6,323,705 B1 | 11/2001 | Shieh et al. | |
| 6,384,649 B1 * | 5/2002 | Boerstler et al. | 327/156 |
| 6,424,185 B1 * | 7/2002 | Wolf | 327/107 |
| 6,441,692 B1 * | 8/2002 | Nakatani et al. | 331/42 |
| 6,462,623 B1 * | 10/2002 | Horan et al. | 331/17 |

* cited by examiner

*Primary Examiner*—My-Trang Nu Ton
(74) *Attorney, Agent, or Firm*—Fogg and Associates, LLC; Jon M. Powers

(57) ABSTRACT

Phase locked loops adapted to filter and store data indicative of the control signal applied to an oscillator permit suppression of tracking in the event of a step change in the phase difference between the reference clock signal and the feedback signal in the phase locked loop. Such phase locked loops further facilitate compensation for drift of the oscillator. Such phase locked loops are suitable for use in timing circuits of communications systems.

28 Claims, 7 Drawing Sheets

DIRECT DIGITAL SYNTHESIZER PHASE LOCKED LOOP

RELATED APPLICATION

This application claims priority to U.S. Provisional Patent Application Serial No. 60/273,017 filed Mar. 2, 2001 and titled "Direct Digital Synthesizer Phase Locked Loop," which is commonly assigned and incorporated by reference herein.

TECHNICAL FIELD

The present invention relates generally to the field of communication systems and, in particular, to systems for establishing a timing signal for synchronization of communications.

BACKGROUND

Communications systems generally require that the operation of synchronous transmission elements within the system be coordinated to some timing signal derived from a reference clock signal. The derived timing signal is synchronized, or locked, to the reference clock signal. One well-known clock synchronization technique is the use of a phase locked loop (PLL).

A PLL is a frequency-selective circuit generally containing a phase comparator, a low-pass filter, and an oscillator coupled in a feedback arrangement. When an input or reference clock signal is applied to the PLL, the phase comparator compares the phase of the reference clock signal with the phase of the oscillator output signal and generates an error signal that is related to the phase relationship between the two signals. This error signal is filtered, amplified, and applied to the oscillator, thus driving the frequency of the oscillator output signal in a direction to more closely align its phase to that of the reference clock signal. When the oscillator output frequency is sufficiently close to the reference frequency, the feedback nature of the PLL causes the oscillator output to lock to the reference clock signal frequency, with the exception of some finite phase difference. The point is called the "zero phase error." While the phases may not be aligned, their frequencies are matched such that the amount of phase difference remains substantially constant. The self-correcting nature of the PLL thus allows the system to track the frequency changes of the reference clock signal once it is locked. A frequency divider is often inserted in the feedback loop when the desired output frequency of the oscillator is some multiple of the reference clock signal frequency.

FIG. 1 is a block diagram of a typical PLL 100. The PLL 100 includes a phase comparator 110 having a first input for the reference clock signal and a second input for the feedback signal. The output of the phase comparator 110 is coupled to the input of a loop filter 120. The output of the loop filter 120 is coupled to the input of an oscillator 130 for providing the control signal to the oscillator 130. The oscillator 130 is often a voltage-controlled oscillator (VCO) or a digitally-controlled or numerically-controlled oscillator (NCO). An NCO generally includes a fixed-frequency oscillator and a synthesizer for providing a scaled output signal derived from a reference frequency of the fixed-frequency oscillator. The output of the oscillator 130 is fed back to the second input of the phase comparator 110 through a frequency divider 140.

Crystal oscillators are generally used in precision PLLs. These oscillators are preferred due to their high accuracy. Such oscillators are capable of maintaining a frequency within 1 ppm of the desired frequency. However, crystal oscillators may be prone to long-term drift.

In communications systems, the timing signal must be maintained, even if the reference clock signal is lost, in order to avoid loss of transmission data. A holdover signal may be applied to the oscillator as a control signal in the event the PLL goes open-loop, i.e., the PLL loses its reference clock signal. The holdover signal is the expected control signal necessary to produce the desired frequency of the timing signal. Due to the possibility of long-term drift, however, this holdover signal may not produce the expected frequency. To compensate, the holdover signal may represent the most recent control signal prior to losing the reference clock. However, the failure causing the loss of the reference clock may also introduce significant noise prior to the loss, thus producing an inappropriate holdover signal.

Another problem encountered by PLLs is a step change in the incoming reference clock signal. A typical PLL will attempt to track a phase or frequency step change in the reference clock signal, causing a disruption in the frequency output of the PLL until the signals are once again locked.

For the reasons stated above, and for other reasons stated below which will become apparent to those skilled in the art upon reading and understanding the present specification, there is a need in the art for alternative systems capable of establishing a communications timing signal.

SUMMARY

The above-mentioned problems with communications systems and other problems are addressed by the present invention and will be understood by reading and studying the following specification.

The various embodiments of the invention make use of phase locked loops adapted to filter and store data indicative of the control signal applied to an oscillator. Such phase locked loops permit suppression of tracking in the event of a step change in the phase difference between the reference clock signal and the feedback signal in the phase locked loop. Such phase locked loops further facilitate compensation for drift of the oscillator. Phase locked loops of the various embodiments are suitable for use in timing circuits of communications systems.

For one embodiment, the invention provides a phase locked loop. The phase locked loop includes a digital phase comparator having a first input for receiving a reference clock signal, a second input for receiving a feedback signal, and an output for providing an error signal; a digital loop filter having an input for receiving the error signal and an output for providing a control signal; a numerically-controlled oscillator having an input for receiving the control signal and an output for providing a timing signal, wherein the feedback signal is derived from the timing signal; a processor coupled to the digital phase comparator; and a machine-readable medium coupled to the processor. The machine-readable medium has instructions thereon adapted to cause the processor to monitor the digital phase comparator, to detect a step change in a phase relationship between the reference clock signal and the feedback signal, and to recenter the digital phase comparator if a step change is detected.

For another embodiment, the invention provides a phase locked loop. The phase locked loop includes a digital phase comparator having a first input for receiving a reference clock signal, a second input for receiving a feedback signal, and an output for providing an error signal; a digital loop filter having an input for receiving the error signal and an output for providing a control signal; a numerically-controlled oscillator having a frequency synthesizer and a fixed frequency source, wherein the frequency synthesizer has a first input for receiving the control signal, a second input for receiving a reference frequency, and an output for providing a timing signal in response to the control signal and the reference frequency; a low-pass filter having an input for receiving the control signal; a processor coupled to the low-pass filter; and a machine-readable medium coupled to the processor, wherein the machine-readable medium has instructions stored thereon adapted to cause the processor to sample and store data from the low-pass filter indicative of an average control signal, to compare the average control signal to a threshold limit, and to trim the oscillator if the average control signal is outside the threshold limit.

For yet another embodiment, the invention provides a method of generating a timing signal. The method includes generating an error signal indicative of a phase relationship between a reference clock signal and a feedback signal using a phase comparator; filtering the error signal to produce a control signal for a frequency synthesizer; generating the timing signal in response to the control signal; deriving the feedback signal from the timing signal; monitoring the phase comparator for a step change in the phase difference between the reference clock signal and the feedback signal; and recentering the phase comparator if a step change in the phase difference between the reference clock signal and the feedback signal is detected.

The invention further includes apparatus and methods of varying scope.

DETAILED DESCRIPTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical, or mechanical changes may be made without departing from the scope of the present invention. The following detailed description is, therefore, not to be taken in a limiting sense, and the scope of the present invention is defined only by the appended claims and equivalents thereof.

Figure 1:
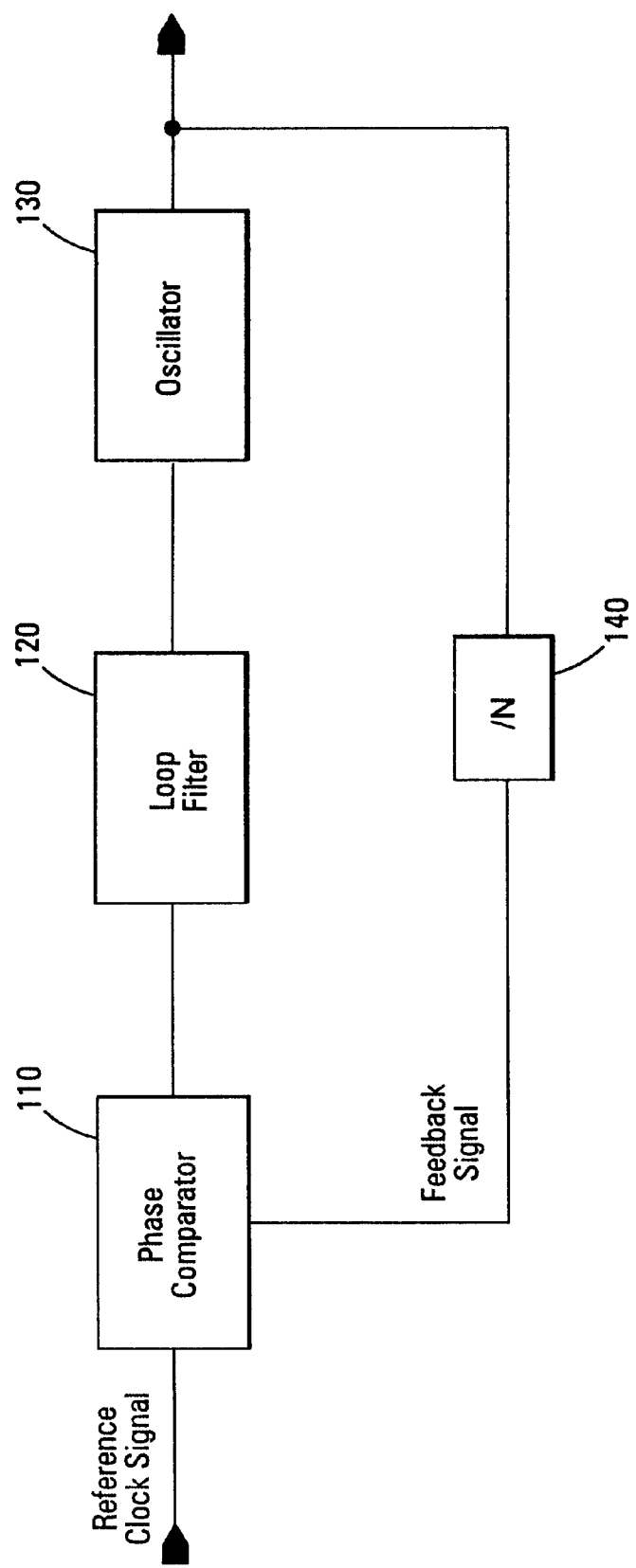
FIG. 1 is a block diagram of a typical phase locked loop.
Figure 2:
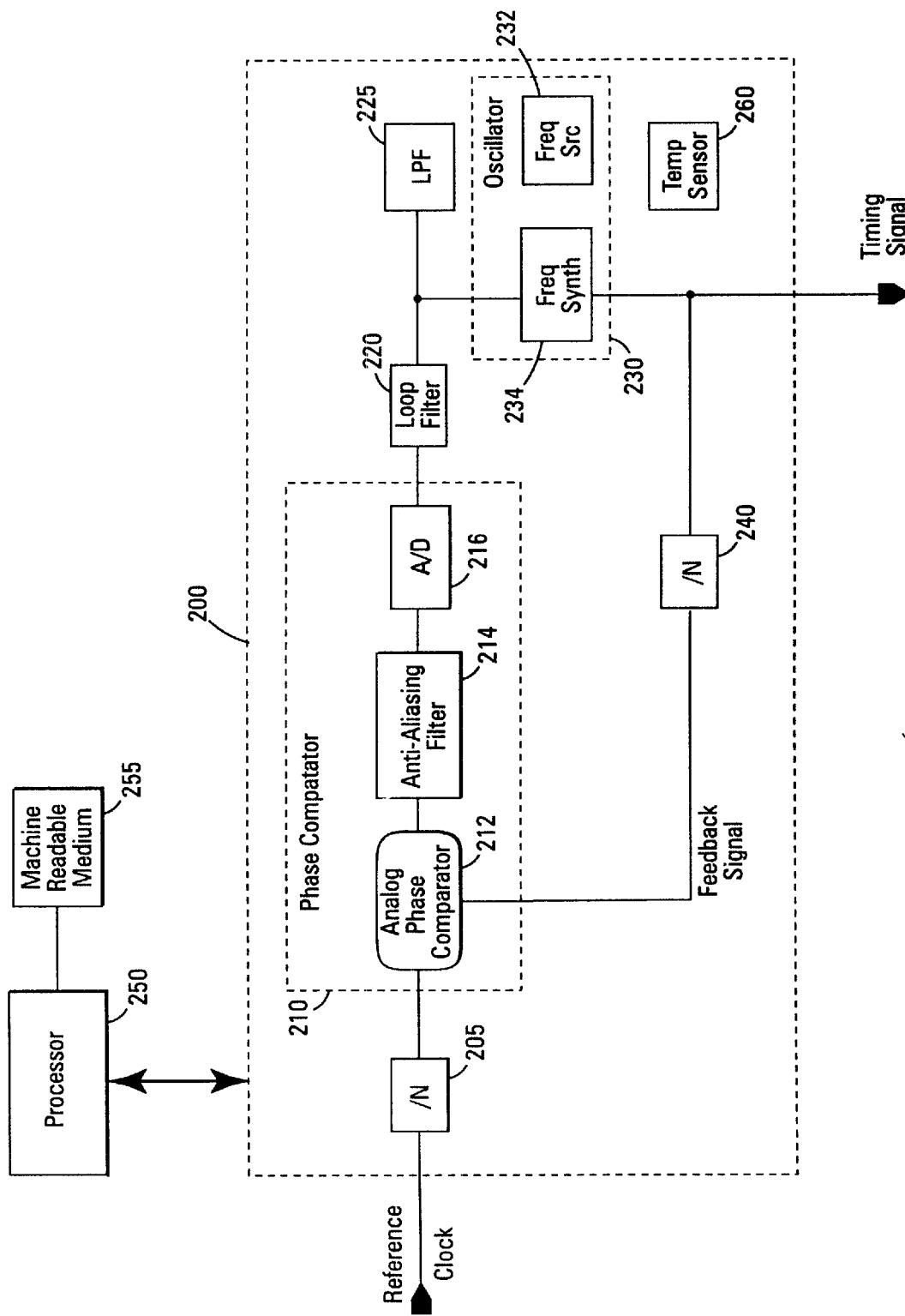
FIG. 2 is a block diagram of a direct digital synthesizer phase locked loop in accordance with an embodiment of the invention.

FIG. 2 is a block diagram of a phase locked loop (PLL) 200 in accordance with an embodiment of the invention. The PLL 200 includes a phase comparator 210, a loop filter 220 and an oscillator 230 in a feedback loop arrangement having a closed-loop bandwidth of K. A reference clock signal is provided to a first input of the phase comparator 210. The reference clock signal may be frequency divided by a selected factor using a frequency divider 205 prior to input to the phase comparator. Frequency divider 205 is shown as a divide-by-N counter. Such frequency division may be useful to extend the phase range of the phase comparator 210, allowing the phase comparator 210 to remain linear while the input phase changes with respect to the phase of the feedback signal. To maintain the frequency of the timing signal equal to the frequency of the reference clock signal prior to frequency division, the feedback signal must be frequency divided by the same factor, N, such as by the frequency divider 240.

For one embodiment, the oscillator 230 is a numerically-controlled oscillator (NCO) including a fixed frequency source 232 and a frequency synthesizer 234. The fixed frequency source 232 may be a crystal oscillator and, in particular, an oven-controlled crystal oscillator (OCXO). As recognized in the art, crystal oscillators are capable of providing highly-accurate output frequencies. Oven-controlled crystal oscillators are crystal oscillators utilizing temperature-controlled environments for the oscillating crystal, thus further improving their accuracy. While the OCXO is utilized for one embodiment, other fixed frequency sources may also be used.

For one embodiment, the frequency synthesizer 234 is a direct digital synthesizer (DDS). The frequency synthesizer 234 scales the frequency of the output signal of the fixed frequency source 232 in response to a control signal. A DDS scales the frequency of the output signal of the fixed frequency source 232 in response to a digital control signal. Thus, the frequency synthesizer 234 derives the timing signal from a reference frequency in response to the control signal. As an example, using a 32-bit DDS as the frequency synthesizer having an input frequency of 10.000 MHz from the fixed frequency source 232 and a desired output frequency of 3.24 MHz, the desired control word or control signal to the DDS would be $(3.24/10.000) \times 2^{32}$ or approximately 1,391,569,404. Stated alternatively, the desired control signal is the desired output frequency divided by the gain ($K_o$) of the frequency synthesizer, where the gain of the frequency synthesizer equals the input frequency times the granularity of the frequency synthesizer, the granularity being the inverse of the maximum control signal or range of control signals.

The phase comparator 210 for one embodiment is a digital phase comparator. The phase comparator 210 generates an error signal indicative of a phase relationship between the reference clock signal and the feedback signal. Where the control signal for the oscillator 230 is digital, it is preferred that the error signal also be digital. While a purely digital phase comparator could be used, such as an XOR logic block, FIG. 2 shows that a digital phase comparator can include analog components. As shown, the phase comparator 210 includes an analog phase comparator 212 for receiving the reference clock signal on a first input and feedback signal on a second input. The analog phase comparator 212 may be, for example, an edge detector phase comparator. The analog phase comparator 212 provides an analog error signal, such as a voltage signal, on its output. The phase comparator 210 further includes an anti-aliasing filter 214 for receiving the output of the analog phase comparator 212 and providing a filtered analog error signal. The anti-aliasing filter 214 is used to prevent higher frequencies, in either the signal or noise, from introducing distortion into the resultant signal. Such filters generally have a sharper cut-off than a typical low-pass filter used to condition a signal. To produce the desired digital error signal, the phase comparator 210 still further includes an analog-to-digital converter 216 to convert the output of the anti-aliasing filter 214 from an analog to digital signal. For one embodiment, the analog-to-digital converter 216 is a 12-bit device, converting the output of the anti-aliasing filter 214 to one of 4,096 binary codes.

The phase comparator 210 has a gain ($K_d$). For the embodiment shown in FIG. 2, $K_d$ is generally equal to the gain of the analog phase comparator 212 (e.g., output voltage range divided by $2\pi$) times the gain of the analog-to-digital converter 216 (e.g., range of output codes divided by the input voltage range). The gain of the anti-aliasing filter 214 is approximately unity.

Figure 3:
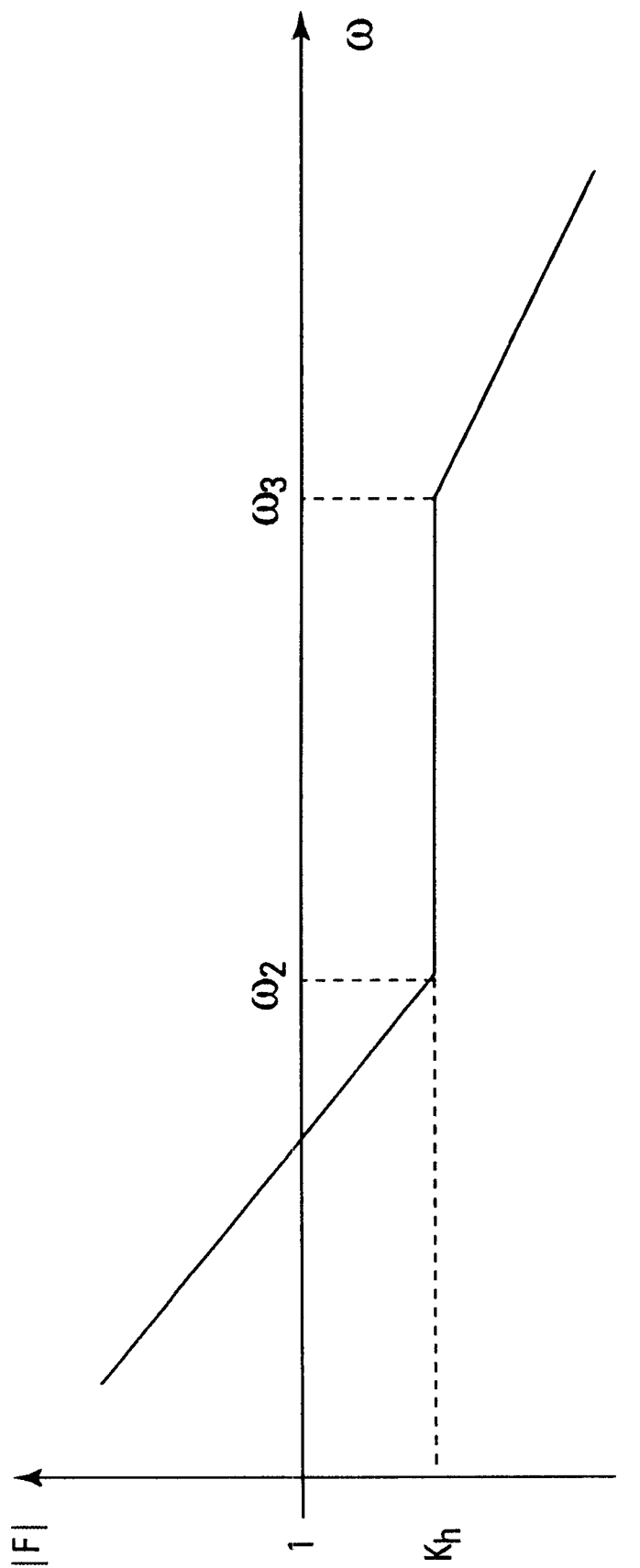
FIG. 3 is a graph of a frequency response of a typical active loop filter.

The error signal from the output of the phase comparator 210 is provided to the input of the loop filter 220. The loop filter 220 conditions the error signal and generates a control signal for input to the oscillator 230. For one embodiment, the loop filter 220 may be implemented as a digital filter to maintain the digital nature of the output of the phase comparator 210. The loop filter 220 preferably functions as an active filter and can be specified by three parameters: $K_h$, the high-frequency gain parameter; $\omega_2$, the location of the zero that sends the dc gain F(0) to infinity; and $\omega_3$, the location of the pole. FIG. 3 is a graph showing the frequency response of a typical active loop filter and the relationship of the foregoing three parameters.

The location of $\omega_2$ generally controls the percentage of overshoot in the step response of the loop filter 220. Thus, it is generally preferred to keep $\omega_2$ as small as possible. For one embodiment, $\omega_2$ is chosen to provide an overdamped system, generally designated to be the case where $\omega_2 < 0.25K$ with an expected overshoot of less than approximately 13%. For another embodiment, $\omega_2$ is chosen to be less than or equal to K/8 with an expected overshoot of less than approximately 10%. While reducing $\omega_2$ will result in reductions in overshoot, it will also detrimentally affect how fast the PLL 200 responds to and corrects a phase error. Accordingly, $\omega_2$ should generally not be set lower than necessary to provide a desired maximum overshoot in a response to a unit phase step.

The location of $\omega_3$ is used to attenuate higher frequency noise, e.g., at the beginning of the jitter region. If $\omega_3$ is set too close to the closed-loop bandwidth K, the PLL 200 may become unstable. For stability, the smallest practical value for $\omega_3$ is generally considered to be 4K. Thus, for one embodiment, $\omega_3$ is chosen to be greater than or equal to 4K.

The remaining loop filter parameter $K_h$ is chosen to produce a desired closed-loop bandwidth K of the PLL 200. If $\omega_2 \ll K$, then the closed-loop bandwidth K is equal to $(K_d \times K_o)/(N \times K_h)$. For one embodiment, $K_d$ is equal to approximately 587 bits/rad, where the gain of the analog phase comparator 212 is approximately $4.5V/2\pi$ or $7.1620 \times 10^{-1}$ V/rad, and the analog-to-digital converter 216 is a 12-bit device requiring a 5V range to advance from a zero output to a full-scale output, thus having a gain of 4,096 bits/5V or 819.2 bits/V; and $K_o$ is equal to approximately $2.3283 \times 10^{-3}$ Hz/bit or approximately $1.4629 \times 10^{-2}$ rad/bit, where the frequency synthesizer 234 is a 32-bit DDS device having an input frequency of 10 MHz. The selected division factor, N, of the loop frequency divider 240 is chosen to ensure that the phase comparator 210 remains linear while the input phase changes with respect to the phase of the output of the oscillator 230. For a system having a closed-loop bandwidth of approximately 0.1 Hz and a reference clock signal of 3.24 MHz, lab data suggests that this phase difference can be as large as approximately 2,027 nS.

Table 1 summarizes the maximum linear range and resolution of the phase comparator 210 having an output range of 4.5V, and using a 3.24 MHz reference clock signal, a 12-bit analog-to-digital converter 216 having an input range of 5V, and a variety of division factors for the frequency dividers 205 and 240. The maximum linear range per $2\pi$ rad is the inverse of the input frequency, i.e., the frequency-divided reference clock signal. The V/nS represents the gain of the analog phase comparator 212 divided by the maximum linear range. The resolution is the gain of the analog-to-digital converter 216 times the V/nS. Note that the results summarized in Table 1 are highly specific to the example embodiment. However, the general discussion provided above can be used to determine the maximum linear range and resolution of other systems.

TABLE 1

Phase Comparator Linear Range and Resolution

| Division Factor N | Resulting Frequency | Max Linear Range (nS/$2\pi$ rad) | V/nS | Resolution bits/nS |
|---|---|---|---|---|
| 2 | 1.62 MHz | 617 | $7.3 \times 10^{-3}$ | 6.0 |
| 4 | 0.81 MHz | 1,234 | $3.6 \times 10^{-3}$ | 3.0 |
| 8 | 405 kHz | 2,469 | $1.8 \times 10^{-3}$ | 1.5 |
| 16 | 202 kHz | 4,938 | $9.1 \times 10^{-4}$ | 0.75 |
| 32 | 101 kHz | 9,877 | $4.6 \times 10^{-4}$ | 0.37 |

Given the desire, in one embodiment, to remain linear for phase differences as large as 2,027 nS, it can be seen from Table 1 that the selected division factor for the frequency dividers 205 and 240 should be at least 8, i.e., the first division factor providing a linear range of greater than 2,027 nS. For another embodiment, the selected division factor is chosen to be approximately twice the minimum factor in order to provide improved phase range and adequate resolution.

As will become apparent below, improving the size of the linear range of the phase comparator will permit moving the zero phase error point to compensate for phase differences between alternate reference clock signals. However, the value of the division factor N should not be made larger than necessary as it can begin to create spurious modulation noise concerns. Note that although the various embodiments have used the same division factor for both frequency dividers 205 and 240, thereby generating a timing signal having substantially the same frequency as the reference clock signal, different division factors could be used for each frequency divider if it is desired to produce a timing signal that is some multiple of the reference clock signal, as is known in the art.

The parameter $K_h$ of the loop filter 220 can now be calculated from the relationship $K = (K_d \times K_o)/(N \times K_h) = 6.283 \times 10^{-2}$ rad/S (corresponding to a desired bandwidth of 0.01 Hz). Thus, $K_h = N \times (6.283 \times 10^{-2})/(K_d \times K_o)$. Table 2 summarized values for the parameter $K_h$ using the phase comparator gain and oscillator gain provided in the examples above, i.e., $K_d$=587 bits/rad and $K_o$=$1.4629 \times 10^{-2}$ rad/bit. As before, the results summarized in Table 2 are highly specific to the example embodiment. However, the general discus sion provided above can be used to determine the maximum linear range and resolution of other systems.

TABLE 2

Settings for $K_h$ to Provide 0.01 Hz Bandwidth

| Division Factor N | $K_d \times K_o/N$ | $K_h$ (rad/S) |
|---|---|---|
| 2 | 4.29 | 0.015 |
| 4 | 2.15 | 0.029 |
| 8 | 1.07 | 0.059 |
| 16 | 0.54 | 0.117 |
| 32 | 0.27 | 0.234 |

As further shown in FIG. 2, a processor 250 may be coupled to, and be a component of, the PLL 200. The processor 250 monitors signal inputs and outputs of the various components of the PLL 200 in response to instructions stored on a machine-readable medium 255. The processor 250 further provides control of various components of the PLL 200 in response to instructions stored on the machine-readable medium 255.

As is known in the art, many of the components of a PLL may be implemented, in part or in whole, using software blocks. The software blocks include one or more instructions that may be executed by a processor, thus causing the processor to perform some task. Specific examples include frequency dividers, filters and analog-to-digital converters. The software blocks may be stored on the machine-readable medium 255.

Machine-readable medium 255 may include fixed mediums, such as Read Only Memory (ROM), flash memory, fixed magnetic disks, dip switches, etc. Machine-readable medium 255 may further include removable mediums, such as magnetic diskettes, magnetic tapes, bar-codes or other scannable indicia, optical disks, etc. Use of a removable machine-readable medium 255 in conjunction with the processor 250 may involve transfer of the instructions to an intermediate storage medium (not shown), such as Random Access Memory (RAM) or some other fixed medium, for use by the processor 250.

For one embodiment, the frequency dividers 205 and 240 are variable and programmable, allowing the processor 250 to receive instructions from the machine-readable medium 255 to select the division factor N.

For another embodiment, the processor 250 monitors the phase comparator 210 for a step change in the phase difference between the feedback signal and the reference clock signal. Such a step change may occur, for example, when the reference clock signal is changed from a first source to a second source, such as from a primary building integrated timing supply (BITS) clock signal to a secondary BITS clock signal. Such a change in reference clock signal sources may be desirable in anticipation of, or in detection of, a failure or removal of the first source. A step change in the phase difference between the feedback signal and the reference clock signal will result in a step change in the output of the phase comparator 210. For one embodiment, the processor 250 monitors the output of the analog-to-digital converter 216 for the step change. For another embodiment, the processor 250 monitors some other signal of the phase comparator 210, such as the output of the analog phase comparator 212 or the anti-aliasing filter 214.

To detect the step change in the output signal, the processor 250 can sample the output signal (such as the output of the phase comparator 210 representing the count of the analog-to-digital converter 216) and store one or more samples in a stack, each new sample occupying the top-most or most recent stack position with the remaining samples being moved to the next stack position. The sample in the bottom-most or oldest stack position is discarded upon storing each new sample in the top-most stack position. For one embodiment, the sample in the top-most stack position is compared with the sample in the next stack position to produce a signal delta. The signal delta is compared to a predetermined, or selected, threshold step change. If the signal delta exceeds the selected threshold step change, a step change is detected. For another embodiment, the sample in the top-most stack position is compared with the sample in a stack position that is two or more stack positions away from the top-most stack position, representing a selected time delta between samples. Such an embodiment may be useful if the phase difference is changing rapidly, but is not a true or ideal step change.

It is recognized that in a software implementation of the step change detection, the stack is merely a set of variables defined in the software instructions. While the individual variables within this set of variables have no tangible physical positions relative to other variables, the variable representing the most recent sample will be referred to herein as the top-most stack position; variables representing immediately preceding samples will be referred to herein as the next stack positions; and the variable representing the oldest sample will be referred to herein as the bottom-most stack position.

A PLL typically will attempt to track the step change in the phase difference between the feedback signal and the reference clock signal. If the step change is to be tracked, the control signal to the oscillator will be adjusted to increase or decrease the output frequency of the oscillator in order to advance or retard the phase of the oscillator output. Such tracking is unnecessary if the step change is not accompanied by a change in frequency of the reference clock signal. For one embodiment, tracking of a step change in the phase difference between the feedback signal and the reference clock signal is suppressed.

For suppression of tracking of a step change in the phase difference between the feedback signal and the reference clock signal, the processor 250 can recenter the phase comparator 210 upon detection of the step change. For one embodiment, the processor 250 recenters the phase comparator 210, in whole or in part, by monitoring and adjusting divide-by-N counters of the frequency dividers 205 and 240. For this embodiment, the processor 250 monitors the count of the divide-by-N counter of the loop frequency divider 240. When the count of the divide-by-N counter of the loop frequency divider 240 reaches a first selected value, the processor 250 resets the count of the divide-by-N counter of the reference frequency divider 205 to a second selected value.

The first selected value and the second selected value may represent an historical relationship between the counts of the divide-by-N counters of the frequency dividers 205 and 240. For example, the first selected value may be the midpoint of the divide-by-N counter of the loop frequency divider 240 and the second selected value may be a snapshot or moving average of the count of the divide-by-N counter of the reference frequency divider 205 when the count of the divide-by-N counter of the loop frequency divider 240 reaches its midpoint. Alternatively, the first and second selected values may be chosen to force a predetermined phase difference, e.g., 90°, between the reference clock signal and the feedback signal. In this manner, the step change in the phase of the reference clock signal can be mitigated without moving the phase of the timing signal.

For another embodiment, primarily for gross phase corrections, the processor 250 may recenter the phase comparator 210 by adjusting the zero phase error point of the analog-to-digital converter 216. This can be accomplished by pre-loading or initializing the analog-to-digital converter 216 with a selected value prior to each sampling in order to offset the count. In this manner, the count of the analog-to-digital converter 216 has a level after the step change that is substantially equal to a level before the step change. Similarly, the zero phase error point may also be adjusted for reasons other than recentering. Adjusting the zero phase error point as described above may also be used to adjust the finite phase difference between the reference clock signal and the timing signal.

While foregoing embodiments were directed to recentering the phase comparator 210 to produce an output level after a step change that is substantially equal to an output level prior to the step change, it is often desired to target a correction that is less than indicated in order to avoid a possible over-correction. As an example, it may be desirable to compensate for a smaller fraction of the detected signal delta. Thus, recentering the phase comparator 210 may produce an output level after the step change that is adjusted toward the output level before the step change, but that compensates for some smaller fraction (<90%) of the detected signal delta.

As noted previously, crystal oscillators are prone to long-term drift despite their high accuracy. Such drift is generally due to aging of the crystal. As the frequency of the OCXO fixed frequency source 232 drifts, the nominal control signal for the DDS frequency synthesizer 234 necessary to produce the target frequency of the timing signal will drift as well. For one embodiment, a low-pass filter 225 is included to receive the output of the loop filter 220. The low-pass filter 225 filters and conditions the output signal of the loop filter 220, producing a signal that is indicative of an average value of the control signal to the frequency synthesizer 234. For one embodiment, the processor 250 samples the output signal of the low-pass filter 225 and compares it to a selected threshold limit. If the sample is outside the threshold limit, the processor 250 trims the oscillator 230 to compensate for the drift of the fixed frequency source 232. For one embodiment, trimming the oscillator 230 includes calibrating the frequency synthesizer 234 to scale the frequency of the output signal of the fixed frequency source 232 to the target frequency in response to a selected value of the control signal. This sampling and trimming can be performed manually at the request of a user, or automatically as a scheduled event.

For a further embodiment, the processor 250 can store the sampled output signal of the low-pass filter 225 for use as the holdover control signal of the frequency synthesizer 234 in the event of loss of the reference clock signal. Because the holdover control signal is generated from the output of the low-pass filter 225, it is buffered from extreme shifts in the output of the loop filter 220 that may immediately precede the loss of the reference clock signal. Thus, this holdover control signal will produce a more accurate timing signal than would be produced absent such buffering. For one embodiment, the holdover control signal represents the most recent filtered control signal data value prior to loss of the reference clock signal. For another embodiment, the holdover control signal represents a filtered control signal data value at a selected time delta prior to loss of the reference clock signal. Such an embodiment may be useful if the most recent filtered control signal data value is detected to contain, or anticipated to contain, noise encountered during or immediately preceding loss of the reference clock signal.

The low-pass filter 225 should generally be capable of holding its data value and ignoring further data input during holdover conditions. Because the holdover condition is entered during periods of questionable accuracy of the reference clock signal, any output generated by the loop filter 220 during this period is also questionable. The low-pass filter 225 should thus ignore the output of the loop filter 220 to avoid generating erroneous data values during the holdover condition. Thus, for one embodiment, the low-pass filter 225 is a digital filter. In response to the processor 250, the digital filter discontinues sampling the output of the loop filter 220 to hold its data value. For a further embodiment, the processor 250 resets the output of the digital filter to the value of the holdover control signal when the holdover control signal represents a filtered control signal data value at a selected time delta prior to loss of the reference clock signal.

Figure 4:
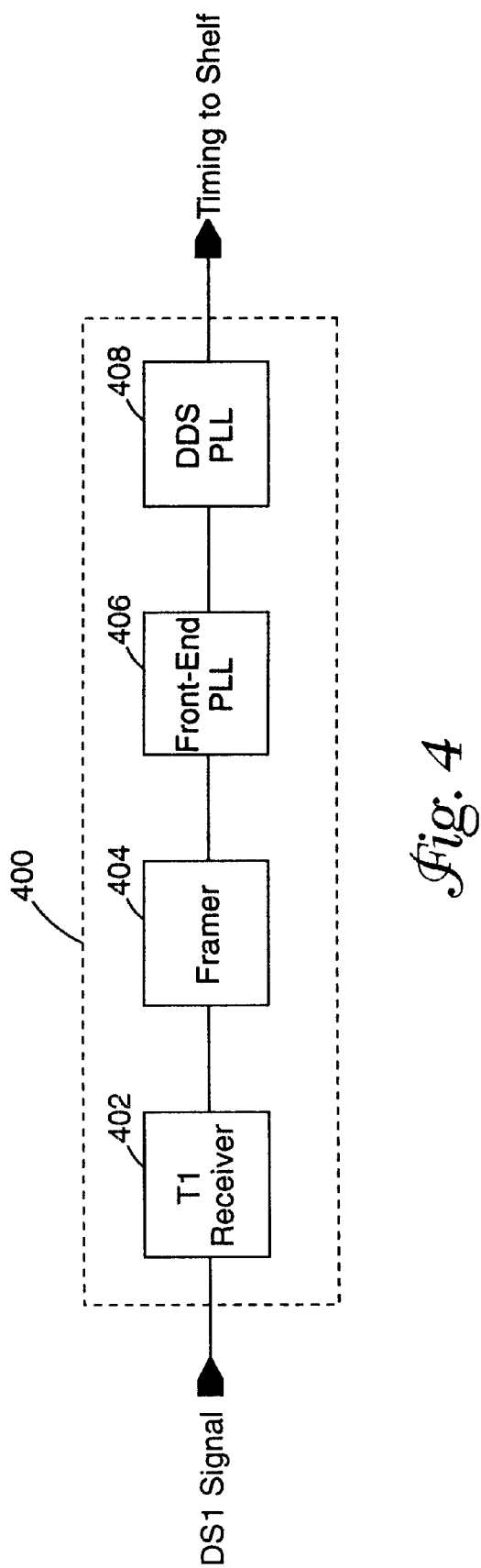
FIG. 4 is a block diagram of a timing circuit in accordance with an embodiment of the invention.

Phase locked loops of the type described above may find use in communications networks such as synchronous communications networks. As an example, PLLs in accordance with the various embodiments of the invention may form a portion of a timing circuit of a shelf controller. FIG. 4 is a block diagram of a timing circuit 400 including a T1 receiver 402 for receiving a communication signal, such as a DS1 signal, and recovering clock and data signals therefrom; a framer 404 for locating a frame pulse and generating the external reference clock signal from the recovered clock and data signals; a first or front-end PLL 406 for generating a first timing signal from a first reference clock signal; and a second PLL 408 in accordance with the various embodiments of the invention for generating a synchronization timing signal (as a second timing signal) derived from the first timing signal (as a second reference clock signal). The synchronization timing signal is provided to a shelf backplane of a communications network element for synchronization of various shelf elements within the network element. The first PLL 406 is used in this embodiment for pre-scaling the input to the second PLL 408 to reduce noise effects on the synchronization timing signal. However, the second PLL 408 could be used to produce the synchronization timing signal directly, without the use of the first PLL 406.

Figure 5:
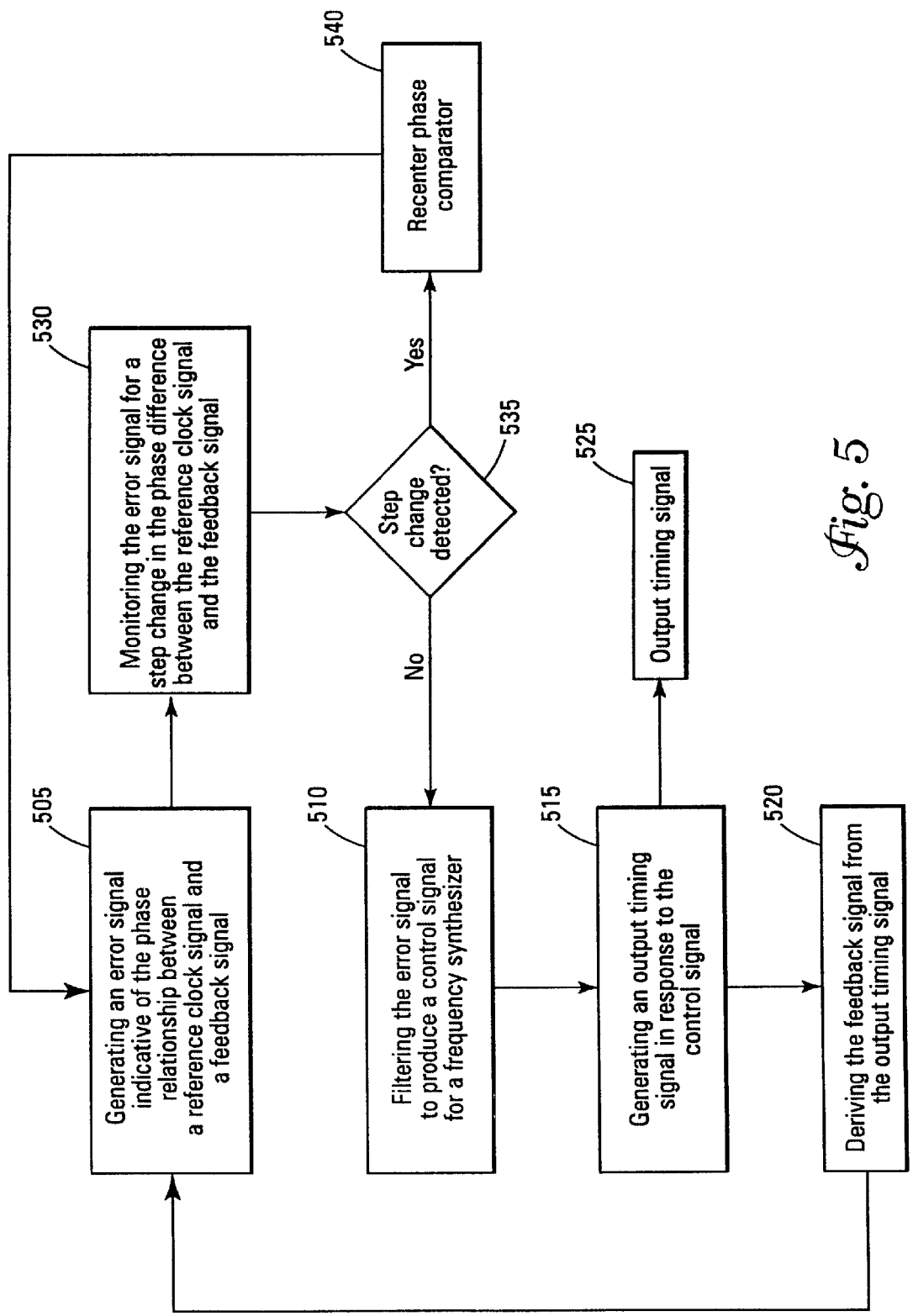
FIG. 5 is a flowchart of a method of generating a timing signal in accordance with an embodiment of the invention.

FIG. 5 is a flowchart of one embodiment of a method of generating a timing signal for use in the synchronization of communications within a synchronous communications network. An error signal indicative of the phase relationship between a reference clock signal and a feedback signal is generated at block 505. The error signal is monitored at block 530 for a step change in the phase difference between the reference clock signal and the feedback signal. If no step change is detected, the error signal is filtered at block 510 to produce a control signal. The timing signal is generated at block 515 in response to the control signal. If a step change is detected at block 535, the phase comparator is recentered at block 540 and the error signal is generated again at block 505. In this manner, the undesirable error signal may be ignored in producing the control signal.

At steady state, the timing signal has a frequency that substantially matches a frequency of the reference clock signal, or a selected multiple of the frequency of the reference clock signal. The timing signal may be output at block 525 for use in the synchronization of communications within a communications system.

To facilitate locking of the phase of the timing signal to the phase of the reference clock signal, a feedback signal is derived from the timing signal at block 520 for application at block 505. The feedback signal has a frequency approaching the frequency of the reference clock signal and, when the phases are locked, has a frequency substantially equal to the frequency of the reference clock signal. Where the timing signal has a frequency that substantially matches a selected multiple of the frequency of the reference clock signal, the timing signal is frequency divided to derive the feedback signal having a frequency approaching the frequency of the reference clock signal.

Figure 6:
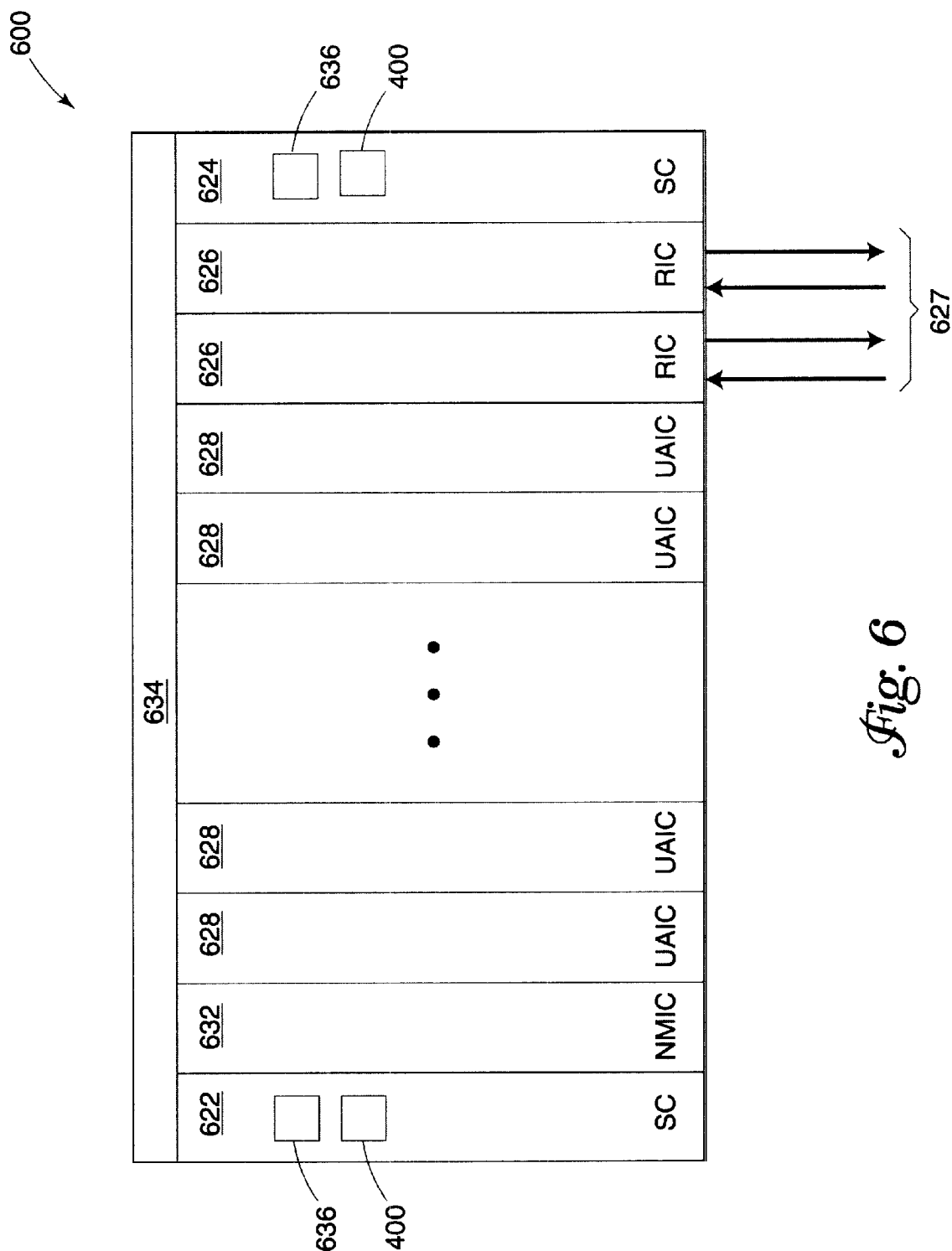
FIG. 6 is a block diagram of a network element in accordance with an embodiment of the invention.

FIG. 6 is a block diagram of a network element 600 in accordance with one embodiment of the invention containing first shelf controller 622 and second shelf controller 624 for redundant control of various shelf elements. The first, or primary, shelf controller 622 receives a primary building integrated timing supply (BITS) signal and a secondary BITS signal. The second, or redundant, shelf controller 624 also receives the primary BITS signal and the secondary BITS signal. The shelf controllers 622/624 each contain a timing circuit 400 and a processor 636 coupled to its associated timing circuit 400. At least one of the timing circuits 400 contains a PLL in accordance with the foregoing embodiments for generating a timing signal from an external reference clock signal, wherein the external reference clock signal is obtained from any of the primary BITS signal, the secondary BITS signal, or a selected reference clock signal from one of the remaining shelf elements. The shelf elements may include ring interface cards 626 for redundant communications with other network elements through lines 627, and user access interface cards 628 for various user-interface functions to the network element 600 from a local area network (LAN). The shelf elements may further include other cards supporting such functions as network management, e.g., network management interface card (NMIC) 632. For one embodiment, the network element 600 contains 18 shelf elements including the two shelf controllers 622/624. Each shelf element is coupled to the shelf backplane 634 for distribution of the second timing signal and for communication among the various shelf elements, e.g., communication between a user access interface card 628 and a ring interface card 626 for carrying out communication to or from other network elements 600.

Figure 8:
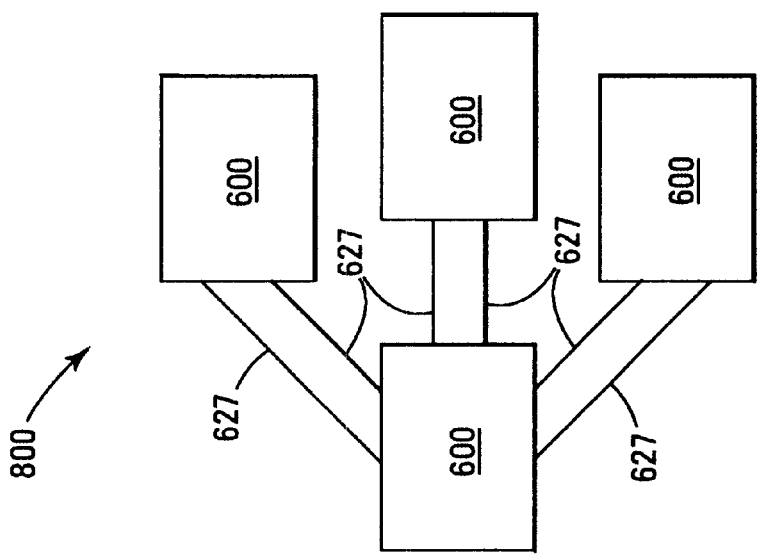
FIG. 8 is a block diagram of a network having a star configuration in accordance with an embodiment of the invention.
Figure 7:
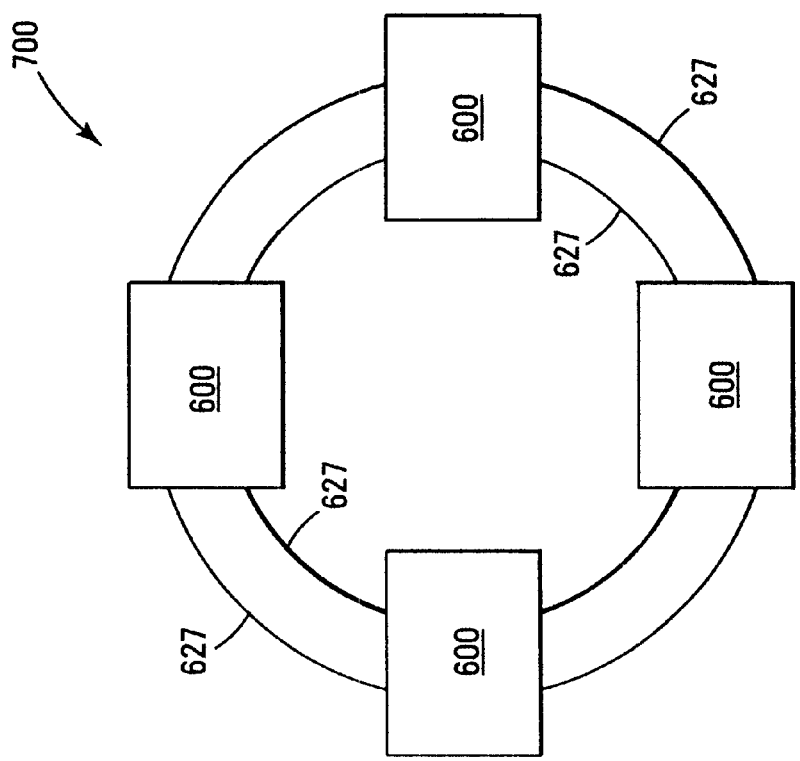
FIG. 7 is a block diagram of a network having a ring configuration in accordance with an embodiment of the invention.

FIG. 7 is a block diagram of a network 700 containing two or more network elements 600 in a ring configuration and having redundant I/O for each network element 600. At least one network element 600 of network 700 contains a PLL in accordance with the various embodiments of the invention. FIG. 8 is a block diagram of a network 800 containing two or more network elements 600 in a star configuration. At least one network element 600 of network 800 contains a PLL in accordance with the various embodiments of the invention.

Conclusion

Phase locked loops adapted to filter and store data indicative of the control signal applied to an oscillator are described herein. Such phase locked loops permit suppression of tracking in the event of a step change in the phase difference between the reference clock signal and the feedback signal in the phase locked loop. Such phase locked loops further facilitate compensation for drift of the oscillator. Phase locked loops in accordance with the invention are suitable for use in timing circuits of communications systems for the synchronization of communications across such systems.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any such adaptations or variations of the invention. It is manifestly intended that this invention be limited only by the following claims and equivalents thereof.

What is claimed is:

1. A phase locked loop, comprising:
    a digital phase comparator having a first input for receiving a reference clock signal, a second input for receiving a feedback signal, and an output for providing an error signal;
    a digital loop filter having an input for receiving the error signal and an output for providing a control signal;
    a numerically-controlled oscillator having an input for receiving the control signal and an output for providing a timing signal, wherein the feedback signal is derived from the timing signal;
    a processor coupled to the digital phase comparator; and
    a machine-readable medium coupled to the processor, wherein the machine-readable medium has instructions stored thereon that cause the processor to monitor the digital phase comparator, to detect a step change in a phase relationship between the reference clock signal and the feedback signal, and to recenter the digital phase comparator if a step change is detected.

2. The phase locked loop of claim 1, wherein the instructions stored on the machine-readable medium that cause the processor to monitor the digital phase comparator comprise instructions that cause the processor to monitor the error signal.

3. The phase locked loop of claim 1, wherein the digital phase comparator further comprises:
    an analog phase comparator having a first input for receiving the first input of the digital phase comparator, a second input for receiving the second input of the digital phase comparator, and an output for providing an analog error signal;
    an anti-aliasing filter having an input for receiving the analog error signal and an output for providing a filtered analog error signal; and
    an analog-to-digital converter having an input for receiving the filtered analog error signal and an output for providing the error signal.

4. The phase locked loop of claim 3, wherein the analog phase comparator is an edge detector phase comparator.

5. The phase locked loop phase locked loop of claim 1, further comprising:
    a first frequency divider coupled between the first input of the digital phase comparator and the reference clock signal; and
    a second frequency divider coupled between the output of the numerically-controlled oscillator and the second input of the digital phase comparator.

6. The phase locked loop of claim 5, wherein the first frequency divider is a divide-by-N counter and the second frequency divider is a divide-by-N counter, and wherein the division factor N is the same for each frequency divider.

7. The phase locked loop of claim 1, wherein the numerically-controlled oscillator further comprises:
    a frequency synthesizer having an input for receiving the control signal and an output for providing the timing signal in response to the control signal and derived from a reference frequency; and
    a fixed frequency source coupled to the frequency synthesizer for providing the reference frequency.

8. The phase locked loop of claim 7, wherein the frequency synthesizer comprises a direct digital synthesizer and the fixed frequency source comprises an oven-controlled crystal oscillator.

9. The phase locked loop of claim 1, wherein a holdover control signal is provided to the input of the numerically-controlled oscillator as the control signal in the event of a loss of the reference clock signal.

10. A phase locked loop, comprising:
- a phase comparator having a first input for receiving a reference clock signal, a second input for receiving a feedback signal, and an output for providing an error signal;
- a loop filter having an input for receiving the error signal and an output for providing a control signal;
- an oscillator having an input for receiving the control signal and an output for providing a timing signal, wherein the feedback signal is derived from the timing signal; and
- a low-pass filter having an input for receiving the control signal and an output for providing a holdover control signal as an average value of the control signal.

11. A phase locked loop, comprising:
- a digital phase comparator having a first input for receiving a reference clock signal, a second input for receiving a feedback signal, and an output for providing an error signal;
- a digital loop filter having an input for receiving the error signal and an output for providing a control signal;
- a numerically-controlled oscillator having an input for receiving the control signal and an output for providing a timing signal, wherein the feedback signal is derived from the timing signal; and
- a low-pass filter having an input for receiving the control signal and an output for providing a holdover control signal as an average value of the control signal.

12. A phase locked loop, comprising:
- a digital phase comparator having a first input for receiving a reference clock signal, a second input for receiving a feedback signal, and an output for providing an error signal;
- a digital loop filter having an input for receiving the error signal and an output for providing a control signal;
- a numerically-controlled oscillator having an input for receiving the control signal and an output for providing a timing signal, wherein the feedback signal is derived from the timing signal;
- a low-pass filter having an input for receiving the control signal;
- a processor coupled to the low-pass filter; and
- a machine-readable medium coupled to the processor, wherein the machine-readable medium has instructions stored thereon that cause the processor to sample and store data from the low-pass filter indicative of an average control signal, to monitor the phase locked loop for a loss of the reference clock signal, and to provide the average control signal to the numerically-controlled oscillator as the control signal if a loss of the reference clock signal is detected.

13. A phase locked loop, comprising:
- a digital phase comparator having a first input for receiving a reference clock signal, a second input for receiving a feedback signal, and an output for providing an error signal;
- a digital loop filter having an input for receiving the error signal and an output for providing a control signal;
- a numerically-controlled oscillator having a frequency synthesizer and a fixed frequency source, wherein the fixed frequency source outputs a reference frequency, wherein the frequency synthesizer has a first input for receiving the control signal, a second input for receiving a the reference frequency, and an output for providing a timing signal in response to the control signal and the reference frequency, further wherein the feedback signal is derived from the timing signal;
- a low-pass filter having an input for receiving the control signal;
- a processor coupled to the low-pass filter; and
- a machine-readable medium coupled to the processor, wherein the machine-readable medium has instructions stored thereon that cause the processor to sample and store data from the low-pass filter indicative of an average control signal, to compare the average control signal to a threshold limit, and to trim the oscillator if the average control signal is outside the threshold limit.

14. A timing circuit, comprising:
- a receiver coupled to receive a communications signal and for recovering clock and data signals therefrom;
- a framer for locating a frame pulse and generating a reference clock signal from the recovered clock and data signals; and
- a phase locked loop coupled to receive the reference clock signal and to generate a timing signal therefrom, the phase locked loop comprising:
  - a phase comparator having a first input for receiving a second reference clock signal, a second input for receiving a feedback signal, and an output for providing an error signal;
  - a loop filter having an input for receiving the error signal and an output for providing a control signal;
  - an oscillator having an input for receiving the control signal and an output for providing a timing signal, wherein the feedback signal is derived from the timing signal; and
  - a low-pass filter having an input for receiving the control signal and an output for providing a holdover control signal as an average value of the control signal.

15. A timing circuit, comprising:
- a receiver coupled to receive a communications signal and for recovering clock and data signals therefrom;
- a framer for locating a frame pulse and generating a reference clock signal from the recovered clock and data signals; and
- a phase locked loop coupled to receive the reference clock signal and to generate a timing signal therefrom, the phase locked loop comprising:
  - a digital phase comparator having a first input for receiving a second reference clock signal, a second input for receiving a feedback signal, and an output for providing an error signal;
  - a digital loop filter having an input for receiving the error signal and an output for providing a control signal;
  - a numerically-controlled oscillator having an input for receiving the control signal and an output for providing a timing signal, wherein the feedback signal is derived from the timing signal; and
  - a low-pass filter having an input for receiving the control signal and an output for providing a holdover control signal as an average value of the control signal.

16. A timing circuit, comprising:

a receiver coupled to receive a communications signal and for recovering clock and data signals therefrom;

a framer for locating a frame pulse and generating a first reference clock signal from the recovered clock and data signals;

a first phase locked loop coupled to receive the first reference clock signal and to generate a second reference clock signal therefrom; and a second phase locked loop coupled to receive the second reference clock signal and to generate a timing signal therefrom, the second phase locked loop comprising:

- a digital phase comparator having a first input for receiving the second reference clock signal, a second input for receiving a feedback signal, and an output for providing an error signal;
- a digital loop filter having an input for receiving the error signal and an output for providing a control signal;
- a numerically-controlled oscillator having an input for receiving the control signal and an output for providing a timing signal, wherein the feedback signal is derived from the timing signal; and
- a low-pass filter having an input for receiving the control signal and an output for providing a holdover control signal as an average value of the control signal.

17. A timing circuit, comprising:

a receiver coupled to receive a communications signal and for recovering clock and data signals therefrom;

a framer for locating a frame pulse and generating a first reference clock signal from the recovered clock and data signals;

a first phase locked loop coupled to receive the first reference clock signal and to generate a second reference clock signal therefrom; and a second phase locked loop coupled to receive the second reference clock signal and to generate a timing signal therefrom, the second phase locked loop comprising:

- a digital phase comparator having a first input for receiving the second reference clock signal, a second input for receiving a feedback signal, and an output for providing an error signal;
- a digital loop filter having an input for receiving the error signal and an output for providing a control signal;
- a numerically-controlled oscillator having an input for receiving the control signal and an output for providing a timing signal, wherein the feedback signal is derived from the timing signal;
- a processor coupled to the digital phase comparator; and
- a machine-readable medium coupled to the processor, wherein the machine-readable medium has instructions stored thereon that cause the processor to monitor the digital phase comparator, to detect a step change in a phase relationship between the reference clock signal and the feedback signal, and to recenter the digital phase comparator if a step change is detected.

18. A timing circuit, comprising:

a receiver coupled to receive a communications signal and for recovering clock and data signals therefrom;

a framer for locating a frame pulse and generating a first reference clock signal from the recovered clock and data signals;

a first phase locked loop coupled to receive the first reference clock signal and to generate a second reference clock signal therefrom; and a second phase locked loop coupled to receive the second reference clock signal and to generate a timing signal therefrom, the second phase locked loop comprising:

- a digital phase comparator having a first input for receiving the second reference clock signal, a second input for receiving a feedback signal, and an output for providing an error signal;
- a digital loop filter having an input for receiving the error signal and an output for providing a control signal;
- a numerically-controlled oscillator having an input for receiving the control signal and an output for providing a timing signal, wherein the feedback signal is derived from the timing signal;
- a low-pass filter having an input for receiving the control signal;
- a processor coupled to the low-pass filter; and
- a machine-readable medium coupled to the processor, wherein the machine-readable medium has instructions stored thereon that cause the processor to sample and store data from the low-pass filter indicative of an average control signal, to monitor the phase locked loop for a loss of the reference clock signal, and to provide the average control signal to the numerically-controlled oscillator as the control signal if a loss of the reference clock signal is detected.

19. A timing circuit, comprising:

a receiver coupled to receive a communications signal and for recovering clock and data signals therefrom;

a framer for locating a frame pulse and generating a first reference clock signal from the recovered clock and data signals;

a first phase locked loop coupled to receive the first reference clock signal and to generate a second reference clock signal therefrom; and a second phase locked loop coupled to receive the second reference clock signal and to generate a timing signal therefrom, the second phase locked loop comprising:

- a digital phase comparator having a first input for receiving the second reference clock signal, a second input for receiving a feedback signal, and an output for providing an error signal;
- a digital loop filter having an input for receiving the error signal and an output for providing a control signal;
- a numerically-controlled oscillator having a frequency synthesizer and a fixed frequency source, wherein the fixed frequency source outputs a reference frequency, wherein the frequency synthesizer has a first input for receiving the control signal, a second input for receiving that reference frequency, and an output for providing a timing signal in response to the control signal and the reference frequency, further wherein the feedback signal is derived from the timing signal;
- a low-pass filter having an input for receiving the control signal;
- a processor coupled to the low-pass filter; and
- a machine-readable medium coupled to the processor, wherein the machine-readable medium has instructions stored thereon that cause the processor to sample and store data from the low-pass filter indicative of an average control signal, to compare the average control signal to a threshold limit, and to trim the oscillator if the average control signal is outside the threshold limit.

20. A shelf controller for controlling synchronization of shelf elements in a communications network element, the shelf controller comprising:
   a first processor; and
   a timing circuit coupled to the first processor and providing a timing signal for controlling synchronization of the shelf elements in the communications network element, wherein the timing circuit comprises:
      a receiver coupled to receive a communications signal and for recovering clock and data signals therefrom;
      a framer for locating a frame pulse and generating a first reference clock signal from the recovered clock and data signals;
      a first phase locked loop coupled to receive the first reference clock signal and to generate a second reference clock signal therefrom; and
      a second phase locked loop coupled to receive the second reference clock signal and to generate a timing signal therefrom, the second phase locked loop comprising:
         a digital phase comparator having a first input for receiving the second reference clock signal, a second input for receiving a feedback signal, and an output for providing an error signal;
         a digital loop filter having an input for receiving the error signal and an output for providing a control signal;
         a numerically-controlled oscillator having an input for receiving the control signal and an output for providing a timing signal, wherein the feedback signal is derived from the timing signal;
         a second processor coupled to the digital phase comparator; and
         a machine-readable medium coupled to the second processor, wherein the machine-readable medium has instructions stored thereon adapted to cause the second processor to monitor the digital phase comparator, to detect a step change in a phase relationship between the reference clock signal and the feedback signal, and to recenter the digital phase comparator if a step change is detected.

21. A network element for a communications network, the network element comprising:
   a shelf backplane; and
   a plurality of shelf elements coupled to the shelf backplane, wherein the plurality of shelf elements includes at least one shelf controller for controlling synchronization of the plurality of shelf elements, the at least one shelf controller comprising:
      a processor; and
      a timing circuit coupled to the processor, wherein the timing circuit comprises:
         a receiver coupled to receive a communications signal and for recovering clock and data signals therefrom;
         a framer for locating a frame pulse and generating a first reference clock signal from the recovered clock and data signals;
         a first phase locked loop coupled to receive the first reference clock signal and to generate a second reference clock signal therefrom; and
         a second phase locked loop coupled to receive the second reference clock signal and to generate a first timing signal therefrom, the second phase locked loop comprising:
            a digital phase comparator having a first input for receiving the second reference clock signal, a second input for receiving a feedback signal, and an output for providing an error signal;
            a digital loop filter having an input for receiving the error signal and an output for providing a control signal;
            a numerically-controlled oscillator having an input for receiving the control signal and an output for providing the first timing signal, wherein the feedback signal is derived from the first timing signal;
            a processor coupled to the digital phase comparator; and
            a machine-readable medium coupled to the processor, wherein the machine-readable medium has instructions stored thereon adapted to cause the processor to monitor the digital phase comparator, to detect a step change in a phase relationship between the reference clock signal and the feedback signal, and to recenter the digital phase comparator if a step change is detected;
   wherein the timing circuit provides a synchronization timing signal to the shelf backplane for the synchronization of the plurality of shelf elements; and
   wherein the synchronization timing signal is derived from the first timing signal.

22. A method of generating a timing signal, comprising:
   generating an error signal indicative of a phase relationship between a reference clock signal and a feedback signal using a phase comparator;
   filtering the error signal to produce a control signal for a frequency synthesizer;
   generating the timing signal in response to the control signal;
   deriving the feedback signal from the timing signal;
   monitoring the error signal for a step change in the phase difference between the reference clock signal and the feedback signal; and
   recentering the phase comparator if a step change in the phase difference between the reference clock signal and the feedback signal is detected.

23. The method of claim 22, wherein monitoring the error signal for a step change in the phase difference between the reference clock signal and the feedback signal further comprises comparing the error signal at a first time to the error signal at a second time and detecting a step change if a signal delta between the first time and the second time exceeds a selected threshold step change.

24. The method of claim 22, wherein the method is performed in the order presented.

25. A method of generating a timing signal, comprising:
   during a time when a reference clock signal is available:
      generating an error signal indicative of a phase relationship between a reference clock signal and a feedback signal;
      filtering the error signal to produce a control signal;
      filtering the control signal;
      sampling the filtered control signal;
      storing filtered control signal data values;

generating the timing signal in response to the control signal;

deriving the feedback signal from the timing signal; and monitoring for a loss of the reference clock signal; and subsequent to detecting a loss of the reference clock signal:

generating a holdover control signal from a filtered control signal data value; and generating a timing signal in response to the holdover control signal.

26. The method of claim 25, wherein the holdover control signal is a most recent filtered control signal data value prior to detecting the loss of the reference clock signal.

27. The method of claim 25, wherein the method is performed in the order presented.

28. A machine-readable medium having instruction stored thereon that cause a processor to perform a method, the method comprising:

sampling values of an error signal, wherein the error signal is indicative of a phase relationship between a reference clock signal and a feedback signal;

monitoring the sampled error signal values for a step change in the phase difference between the reference clock signal and the feedback signal; and recentering a phase comparator if a step change in the phase difference between the reference clock signal and the feedback signal is detected.

* * * * *